United States Patent
Takiguchi et al.

(10) Patent No.: US 10,317,593 B2
(45) Date of Patent: Jun. 11, 2019

(54) IMAGE DEVICE AND IMAGING APPARATUS

(71) Applicant: Sony Corporation, Tokyo (JP)

(72) Inventors: Nozomi Takiguchi, Kanagawa (JP); Shinji Imaizumi, Kanagawa (JP); Masanori Iwasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/125,028

(22) PCT Filed: Apr. 8, 2015

(86) PCT No.: PCT/JP2015/001972
§ 371 (c)(1),
(2) Date: Sep. 9, 2016

(87) PCT Pub. No.: WO2015/159509
PCT Pub. Date: Oct. 22, 2015

(65) Prior Publication Data
US 2017/0023713 A1    Jan. 26, 2017

(30) Foreign Application Priority Data

Apr. 16, 2014   (JP) .................................. 2014-085042

(51) Int. Cl.
*H01L 27/14* (2006.01)
*G02B 5/22* (2006.01)
(Continued)

(52) U.S. Cl.
CPC ............ *G02B 5/223* (2013.01); *C09B 23/107* (2013.01); *G02B 5/201* (2013.01); *G02B 5/208* (2013.01);
(Continued)

(58) Field of Classification Search
CPC .......... H01L 27/1462; H01L 27/14621; H01L 27/14625; H01L 27/14627;
(Continued)

(56) References Cited

U.S. PATENT DOCUMENTS

2011/0013055 A1    1/2011  Sul et al.
2011/0224334 A1*   9/2011  Maeda ................. C07D 209/14
                                                         524/89

(Continued)

FOREIGN PATENT DOCUMENTS

JP        08-211336      8/1996
JP        2001-315240    11/2001

(Continued)

OTHER PUBLICATIONS

International Search Report dated Jun. 16, 2015 in international application No. PCT/JP2015/001972 (3 pages).

(Continued)

*Primary Examiner* — John A McPherson
(74) *Attorney, Agent, or Firm* — K&L Gates LLP

(57) ABSTRACT

An imaging device, comprising: an infrared light absorption layer including a cyanine dye represented by Chemical Formula (A) below: wherein $R_1$ and $R_2$ are selected from the group consisting of: a chain alkyl group, a cyclic alkyl group, a phenyl group, and a benzyl group; wherein the chain alkyl group and the cyclic alkyl group including at least one group member selected from the group consisting of: 1) a first group having one or more hydrogen atoms in a first alkyl group substituted with at least one functional group selected from the group consisting of: a halogen atom, an alkoxy group, an alkanoloxy group, an amino group, a thiol group, and a mercapto group; 2) a second group having at least one reactive group selected from the group consisting of: a vinyl group, an acrylic group, a carbonyl group, a (Continued)

carboxyl group, an alkenyl group, an alkenyloxy group, an alkoxycarbonyl group, a nitrile group, a carboxyl group, a carbonyl group, a sulfonyl group, a sulfamoyl group, a carbamoyl group, a benzoyloxy group, and a cyano group, wherein the reactive group is any one of introduced at a terminal alkyl group of at least one of the chain alkyl group and the cyclic alkyl group and positioned two or more carbon atoms away from an indoline ring; 3) an unsubstituted chain alkyl group; and 4) an unsubstituted cyclic alkyl group; and wherein $X^-$ represents an anion.

19 Claims, 6 Drawing Sheets

(51) Int. Cl.
    *H01L 27/146*     (2006.01)
    *G02B 5/20*     (2006.01)
    *C09B 23/10*     (2006.01)
    *G02B 5/28*     (2006.01)
    *G02B 13/00*     (2006.01)
    *G02B 1/14*     (2015.01)
    *G02B 1/11*     (2015.01)

(52) U.S. Cl.
    CPC ......... *G02B 5/282* (2013.01); *G02B 13/0085* (2013.01); *H01L 27/1462* (2013.01); *G02B 1/11* (2013.01); *G02B 1/14* (2015.01)

(58) Field of Classification Search
    CPC . H01L 27/14629; C09B 23/107; C09B 23/10; C09B 23/102; C09B 23/086; G02B 5/208; G02B 5/223; G02B 5/201; G02B 5/282; G02B 13/0085; G03F 7/0007

USPC ...................................... 257/432, 440; 430/7
See application file for complete search history.

(56) References Cited

U.S. PATENT DOCUMENTS

| | | | |
|---|---|---|---|
| 2014/0091419 A1 | 4/2014 | Hasegawa et al. | |
| 2015/0146057 A1 | 5/2015 | Konishi et al. | |

FOREIGN PATENT DOCUMENTS

| | | |
|---|---|---|
| JP | 2002-366048 | 12/2002 |
| JP | 2004-200360 A | 7/2004 |
| JP | 2005-044573 | 2/2005 |
| JP | 2007-141876 A | 6/2007 |
| JP | 2009-031720 | 2/2009 |
| JP | 2011-159800 A | 8/2011 |
| JP | 2012-169489 | 9/2012 |
| JP | 2013-137337 | 7/2013 |
| JP | 2013-138158 A | 7/2013 |
| JP | 2013-155353 | 8/2013 |
| JP | 2013-218312 A | 10/2013 |
| JP | 2014-031435 | 2/2014 |
| KR | 10-2008-0060411 | 7/2008 |
| WO | 2012/169447 | 12/2012 |
| WO | 2013/161492 | 10/2013 |
| WO | 2014/030628 A1 | 2/2014 |

OTHER PUBLICATIONS

Japanese Office Action dated Mar. 6, 2018 in corresponding Japanese Application No. 2014-085042.

Japanese Office Action dated Oct. 2, 2018 in corresponding Japanese Application No. 2014-085042.

* cited by examiner

IMAGE DEVICE AND IMAGING APPARATUS

CROSS-REFERENCE TO RELATED APPLICATIONS

The present application claims the benefit of International Application No. PCT/JP2015/001972, filed Apr. 8, 2015, which claims priority to Japanese Application No. 2014-085042, filed Apr. 16, 2014, the entire contents of which are incorporated herein by reference.

TECHNICAL FIELD

The present technology relates to an imaging device and an imaging apparatus. More particularly, the present technology relates to a technology to improve characteristics of the imaging device and the imaging apparatus.

BACKGROUND ART

In general, a solid-state imaging device (image sensor) having a structure of a charge coupled device (CCD) or a complementary metal oxide semiconductor (CMOS) is mounted on an imaging apparatus such as a video camera or a digital still camera. On the other hand, CCD and CMOS image sensors have sensitivity to the near-ultraviolet wavelength band and the near-infrared wavelength band. In the imaging apparatus, a light signal in the wavelength band except for the visibility of people (about a wavelength of 400 to 700 nm) becomes a noise component, which causes a reduction in image quality.

Thus, in the imaging apparatus in related art, an infrared light cut filter is arranged in front of the solid-state imaging device in order to make the detection wavelength close to the visibility of people and improve the color reproducibility, and the light in the near-infrared wavelength band is removed. There is an absorption type infrared light cut filter using a material that absorbs the infrared band and a reflection type infrared light cut filter using the interference of multilayer films. For example, PTL 1 discloses an absorption type near infrared light cut filter that contains a phthalocyanine compound having a specific structure.

In recent years, the downsizing of the imaging apparatus and the thinning of the imaging optical system have been progressively made. There is suggested an imaging device in which a mechanism that absorbs infrared light is provided in a chip in place of the above infrared light cut filter (refer to PTLs 2 to 5). For example, in an imaging device described in PTL 2, an infrared light absorbing function is given to a lens and a planarizing layer. Further, in an imaging device described in PTL 3, the near infrared light noise is eliminated by using a dye containing lens that contains a dye with an absorption maximum value in a wavelength band of 600 to 800 nm.

Further, in a semiconductor imaging device described in PTL 4, a color filter layer contains an infrared light absorbing dye, whereby an infrared light cutting function is given to the color filter layer. On the other hand, in a solid-state imaging device described in PTL 5, a near infrared light absorption layer containing near-infrared light absorbing particles which includes oxide crystallites containing at least Cu and/or P and have a number average agglomerated particle diameter of 5 to 200 nm is provided on a lens.

CITATION LIST

Patent Literature

PTL 1: JP 2013-218312 A
PTL 2: JP 2004-200360 A
PTL 3: JP 2013-138158 A
PTL 4: JP 2007-141876 A
PTL 5: JP 2011-159800 A

SUMMARY

Technical Problem

However, the infrared light cut filter described in PTL 1 has a thickness of about 1 to 3 mm, and thus it is difficult to make a module having this filter arranged on an imaging device thinner. On the other hand, like the imaging devices described in PTLs 2 to 5, when the mechanism that absorbs infrared light is provided in a chip, it is easy to reduce the thickness. In order to obtain a sufficient infrared light absorption capability by this configuration, it is necessary to add a large amount of infrared light absorber and thicken an infrared light absorption layer.

For example, in the case of the imaging devices described in PTLs 2 to 4, it is necessary to allow a large amount of infrared light absorber to be contained in the lens or the color filter in order to obtain a sufficient infrared light absorption capability. When the content of the infrared light absorber is increased, the visible light transmission amount is decreased. Further, in the imaging device described in PTL 5, since the infrared light absorption layer is provided on the lens, the thickness of the infrared light absorption layer does not become uniform. In order to obtain a sufficient infrared light absorption capability in all positions, it is necessary to thicken the infrared light absorption layer. This causes problems in terms of downsizing and imaging performance.

In the present disclosure, it is desirable to provide an imaging device in which the thickness of a module can be reduced without lowering the imaging performance and an imaging apparatus.

Solution to Problem

The present inventors have suggested an imaging device having a low refractive index layer provided on an on-chip lens and an infrared absorption layer provided thereon (Japanese Patent Application No. 2012-230325, Japanese Patent Application No. 2013-244424) as a configuration in which the thickness of a module can be reduced without lowering the imaging performance. In the imaging device suggested by the present inventors, an infrared component is removed by the infrared absorption layer. Accordingly, it is not necessary to provide an infrared cut filter as a separate member, whereby the thickness of an imaging optical system can be reduced. The present inventors have made a study on the imaging device having the structure, aiming at further improvement in imaging performance. As a result, the present inventors have found out that the use of a cyanine dye having a specific structure allows an infrared light absorption layer with excellent infrared light absorption characteristics and a high visible light transmittance to be achieved, and completed the present disclosure.

That is, an imaging device includes: an infrared light absorption layer including a cyanine dye represented by Chemical Formula (A) below.

<Chemical Formula (A)>

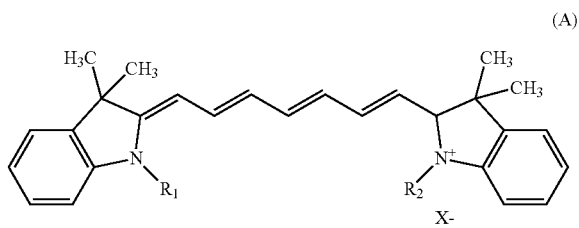

wherein $R_1$ and $R_2$ are selected from the group consisting of: a chain alkyl group, a cyclic alkyl group, a phenyl group, and a benzyl group; wherein the chain alkyl group and the cyclic alkyl group including at least one group member selected from the group consisting of: 1) a first group having one or more hydrogen atoms in a first alkyl group substituted with at least one functional group selected from the group consisting of: a halogen atom, an alkoxy group, an alkanoloxy group, an amino group, a thiol group, and a mercapto group; 2) a second group having at least one reactive group selected from the group consisting of: a vinyl group, an acrylic group, a carbonyl group, a carboxyl group, an alkenyl group, an alkenyloxy group, an alkoxycarbonyl group, a nitrile group, a carboxyl group, a carbonyl group, a sulfonyl group, a sulfamoyl group, a carbamoyl group, a benzoyloxy group, and a cyano group, wherein the reactive group is any one of introduced at a terminal alkyl group of at least one of the chain alkyl group and the cyclic alkyl group and positioned two or more carbon atoms away from an indoline ring; 3) an unsubstituted chain alkyl group; and 4) an unsubstituted cyclic alkyl group; and wherein $X^-$ represents an anion.

The imaging apparatus according to the present disclosure includes the above imaging device.

Advantageous Effects of Invention

According to the present disclosure, an infrared light absorption layer with a low infrared light transmittance and a high visible light transmittance is included, and thus the thickness of a module can be reduced without lowering the imaging performance. Note that the effects described herein are not necessarily limited, and the effects may be any of the effects described in the present disclosure.

DESCRIPTION OF EMBODIMENTS

Hereinafter, embodiments to perform the present disclosure will be described in detail with reference to the attached drawings. Note that the present disclosure is not limited to the following embodiments. Further, the present disclosure will be described in the following order:

1. First Embodiment
 (an example of an imaging device including an infrared light absorption layer)
2. Second Embodiment
 (an example of an imaging device having a protective layer provided on an infrared light absorption layer)
3. Third Embodiment
 (an example of an imaging device having a light antireflection layer provided on the uppermost layer)
4. Fourth Embodiment
 (an example of an imaging device having an infrared light reflection layer provided on an infrared light absorption layer)
5. Fifth Embodiment
 (an example of an imaging device having an infrared light absorption layer formed on a supporting substrate)
6. Sixth Embodiment
 (an example of an imaging apparatus including an infrared light absorption layer)

1. First Embodiment

Figure 1:
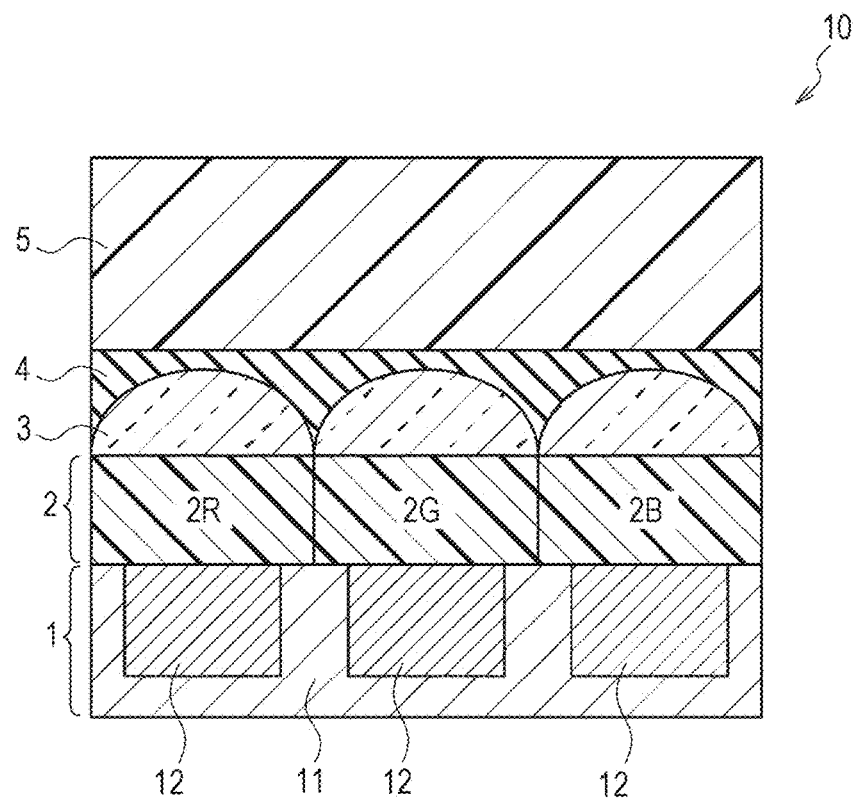
FIG. 1 is a cross-sectional view schematically showing a structure example of an imaging device of a first embodiment of the present disclosure.

First, an imaging device according to the first embodiment of the present disclosure will be described. FIG. 1 is a cross-sectional view schematically showing a structure example of an imaging device of the present embodiment. An imaging device 10 of the present embodiment is mounted on an imaging apparatus such as a video camera or a digital still camera, and includes an on-chip lens 3, a planarizing layer 4, and an infrared light absorption layer 5 as shown in FIG. 1. Specifically, in the imaging device 10 of the present embodiment, a color filter layer 2, an on-chip lens 3, planarizing layer 4, and an infrared light absorption layer 5 are formed in this order on a photoelectric conversion layer 1.

<Photoelectric Conversion Layer 1>

The photoelectric conversion layer 1 detects the incident light as an electrical signal. For example, a plurality of photoelectric conversion elements 12 is formed on a substrate 11 of silicon or the like. The structure of the photoelectric conversion layer 1 is not particularly limited, and CCD and CMOS structures may be employed. Further, the photoelectric conversion layer 1 may be an imaging device in which the photoelectric conversion elements 12 are arranged two-dimensionally (matrix shape), or may be a linear sensor in which the photoelectric conversion elements 12 are arranged one-dimensionally (linear shape).

<Color Filter Layer 2>

The color filter layer 2 is configured to include, for example, three color filters of a red filter 2R which transmits a red wavelength band, a green filter 2G which transmits a green wavelength band, and a blue filter 2B which transmits a blue wavelength band. Note that the transparent wavelength of each of the color filters included in the color filter layer 2 is not limited to the three colors of red, green, and blue, and it can be appropriately selected depending on the specification of the imaging device or the like. Further, materials forming each of the color filters are not particularly limited and well-known materials can be used.

The red filter 2R, the green filter 2G, and the blue filter 2B are respectively arranged on the corresponding photoelectric conversion elements 12. Thus, the light in a specific wavelength band that is transmitted through the color filters 2R, 2G, and 2B arranged on the photoelectric conversion elements 12 is incident upon each of the photoelectric conversion elements 12. The output of the photoelectric conversion elements 12 can be defined as the intensity of the light in the wavelength band that is transmitted through the color filters 2R, 2G, and 2B.

Further, the color filter layer 2 may have an absorption maximum wavelength at 600 to 1200 nm. As described above, the infrared light removal performance can be further improved by giving the infrared ray absorption capability to the color filter layer 2, in addition to the infrared light absorption layer 5 to be described below. In order to give the infrared light absorption capability to the color filter layer 2, for example, each of the color filters 2R, 2G, and 2B may contain a material that absorbs infrared light.

Examples of infrared light absorption materials to be contained in the color filters 2R, 2G and 2B include a compound containing the transition metal in the fourth period of the periodic table such as $KCuPO_4$, an iron oxide or a tungsten oxide, a conductive oxide such as indium tin oxide (ITO), a squarylium compound, a diimmonium compound, an anthraquinone compound, a cyanine compound, a phthalocyanine compound, an azo complex, an Ni complex, a Co complex, a Cu complex, an Fe complex, a pyrrolopyrrole compound, a thiourea compound, and an acetylene polymer. Among these infrared light absorption materials, the compound containing the transition metal, conductive oxide, squarylium compound, phthalocyanine compound, azo complex, Ni complex, Co complex, Cu complex, Fe complex, and pyrrolo pyrrole compound are particularly preferred from the viewpoint of heat resistance.

Note that the color filter layer 2 is provided, if necessary, for example, in the case where a monochrome image is obtained from the output of each of the photoelectric conversion elements 12, the color filter layer 2 is unnecessary. In the case where the color filter layer 2 is not provided, the on-chip lens 3 may be directly laminated on the photoelectric conversion layer 1 or may be laminated through a certain layer.

<On-Chip Lens 3>

The on-chip lens 3 focuses the incident light on each of the photoelectric conversion elements 12, and is formed of, for example, a high refractive index material having optical transparency and a refractive index higher than 1.5. Examples of high refractive index materials to form the on-chip lens 3 include an inorganic material having a high refractive index such as SiN. An organic material having a high refractive index, such as an episulfide resin, a thiethane compound or a resin thereof can also be used.

Further, a metal thiethane compound and a polymerizable composition containing the same as described in JP 2003-139449 A is used, whereby the refractive index of the on-chip lens 3 can be further improved. Further, when an oxide or nitride having a refractive index of about 2 to 2.5 (e.g., $TiO_2$, $ZrO_2$, $Ta_2O_5$, $Nb_2O_5$, ZnO or $Si_3N_4$) is added to these resins, a higher refractive index material is obtained.

The method of forming the on-chip lens 3 is not particularly limited. For example, the on-chip lens 3 can be formed by forming a lens-shaped resist film on a lens material film, and performing an etchback process. Besides this, the on-chip lens 3 may be formed by patterning a photosensitive resin film using a photolithography technique, deforming the resultant film into a lens shape by a reflow process, or may be formed by deforming the photosensitive resin film.

The shape of the on-chip lens 3 is not particularly limited, and various kinds of lens shapes such as hemispherical and semi-cylindrical shapes may be employed. As shown in FIG. 1, the on-chip lens 3 may be provided with respect to each photoelectric conversion elements 12, or alternatively, one on-chip lens 3 may also be provided with respect to each of the photoelectric conversion elements 12.

<Planarizing Layer 4>

The planarizing layer 4 absorbs the lens shape of the on-chip lens 3 and flattens the surface, and the planarizing layer 4 can be formed of, for example, a low refractive index material having optical transparency and a refractive index lower than the on-chip lens 3. Then, the light entering the on-chip lens 3 from the planarizing layer 4 is refracted at the interface between the planarizing layer 4 and the on-chip lens 3, and is focused on each of the photoelectric conversion elements 12 corresponding to the on-chip lens 3.

The refractive index of the planarizing layer 4 may be smaller than that of the on-chip lens 3. From the viewpoint of improving the effect by the on-chip lens 3, a difference in refractive index between the planarizing layer 4 and the on-chip lens 3 is preferably as large as possible. Examples of low refractive index materials to form the planarizing layer include porous silica (refractive index $n<=1.2$), a fluorine compound (refractive index $n<=1.2$) such as MgF, and a silicone resin (refractive index $n=1.3$ to 1.4). The thickness of the planarizing layer 4 is, for example, from about 10 nm to 2 μm, and is not limited to the range. It is preferably as thin as possible.

<Infrared Light Absorption Layer 5>

The infrared light absorption layer 5 removes an infrared light component from the light incident on the imaging device 10, contains a cyanine dye represented by Chemical Formula 2 below, and is formed, for example, on the planarizing layer 4.

<Chemical Formula 2>

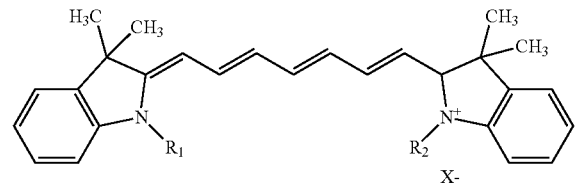

Note that in Chemical Formula 2 above, $R_1$ and $R_2$ represent a chain or cyclic alkyl group, a group having one or two or more hydrogen atoms in the alkyl group substituted with at least one functional group of a halogen atom, an alkoxy group, an alkanoloxy group, an amino group, a thiol group, and a mercapto group, a group having at least one reactive group of a vinyl group, an acrylic group, a carbonyl group, a carboxyl group, an alkenyl group, an alkenyloxy group, an alkoxycarbonyl group, a nitrile group, a carboxyl group, a carbonyl group, a sulfonyl group, a sulfamoyl group, a carbamoyl group, a benzoyloxy group, and a cyano group introduced to the terminal of the alkyl group or a position where two or more carbon atoms are away from the indoline ring, a phenyl group or benzyl, and may be the same as or different from each other. X represents an anion.

The use of the cyanine dye represented by Chemical Formula 2 allows the visible light transmittance to be improved. There are known cyanine compounds having various kinds of skeletons. For example, in the case of a cyanine compound that has a structure having a skeleton with a cyclohexene ring in the center of a main skeleton, the visible light transmittance is decreased. Thus, this is not desirable. In the case of a cyanine compound in which the a conjugation length of an indoline ring is lengthened or which has a functional group effective in lengthening the conjugation length of a substituent on N, the visible light transmittance is decreased similarly. Thus, this is not preferable.

As described above, the structure of the cyanine dye having a high visible light transmittance is limited. However, for example, in the case of a structure which does not extend the a conjugated system, the visible light transmittance is not decreased even when various kinds of substituents are bonded to the indoline ring or N. However, from the reason described above, when a cyclic structure is introduced to the double bond chain between indoline rings, the visible light transmittance is decreased. Thus, this is not desirable.

In the cyanine dye to be contained in the infrared light absorption layer 5, from the viewpoint of improving the visible light transmittance, one or both of $R_1$ and $R_2$ in Chemical Formula 2 are preferably an alkyl group having 1 to 16 carbon atoms such as a methyl group, an ethyl group or a propyl group; a group having a siloxane, alkoxysilane, acrylic or epoxy structure introduced to the terminal of the alkyl group; a polyether group; a benzyl group; or a phenyl group.

The kind of anion ($X^-$) of the cyanine dye is not particularly limited. For example, a halide ion such as a chloride ion, a perhalogen acid ion such as a perchlorate ion, a tetrafluoroborate ion, a tetrafluorophosphorate ion, a tetrafluoroantimonate ion, a bis(halogenoalkylsulfonyl)imide ion, a tris(halogenoalkylsulfonyl)methide ion, a tetrakis(halogenoalkyl)borate ion, a bis(dicarboxylate)borate ion, a borate dianion, a perfluorinated anyl borate, a perfluorinated alkoxy aluminate, a carborane anion or the like can be used.

Further, the heat resistance of the infrared light absorption layer 5 can be improved by selecting and using the anion ($X^-$) having a specific structure. In order to improve the heat resistance of the infrared light absorption layer 5, it is desirable to select a molecule that has a high molecular weight and hardly causes an oxidation reaction. Specifically, at least one anion selected from a tetrafluoro antimonate ion, a bis(halogenoalkylsulfonyl)imide ion, a tetrakis(halogeno alkyl)borate ion, and a bis(dicarboxylate)borate ion is used, whereby the infrared light absorption layer 5 having high heat resistance can be formed.

Preferably, the cyanine dye has an absorption maximum wavelength at 600 to 1200 nm and has a ratio of a molar extinction coefficient in the absorption maximum wavelength in the range of 400 to 600 nm to a molar extinction coefficient in the absorption maximum wavelength in the range of 600 to 1200 nm of 0.1 or less. Consequently, both the infrared light shielding ratio and the visible light transmittance can be improved.

The infrared light absorption layer 5 can be formed of the resin composition that contains the cyanine dye and the binder resin. The binder resin to be used for the infrared light absorption layer 5 is not particularly limited, and various kinds of resins such as a thermoplastic resin, a heat-curable resin, and a light-curable resin can be used. However, from the viewpoint of heat resistance and imaging performance, a binder resin having a glass transition point Tg of 150° C. or more is preferred, a binder resin having a melting point of 150° C. or more is more preferred, and a binder resin which turns yellow by heating at a temperature of 150° C. or more is particularly preferred.

Specifically, an epoxy resin, an acrylic resin, a silicone (siloxane) resin, a polycarbonate resin, a polyethylene resin or the like can be used as the binder resin. Among these resins, the heat-curable or light-curable resin that does not have an absorption maximum wavelength at 400 to 600 nm is particularly preferred for use.

Further, when a resin containing a functional group having a high oxidative capacity, such as a carboxyl group, is used as the binder resin, the cyanine dye is oxidized. As a result, the heat resistance may be reduced. From the viewpoint of improving the heat resistance, it is preferable to use a resin including a bond that is highly stable and has a relatively low oxidative capacity, such as a siloxane bond (—Si—O—) or a carbon-oxygen bond (—C—O—), as the binder resin.

Particularly, a resin having a siloxane bond as a main skeleton is preferred.

Note that the dispersion state of the cyanine dye in the resin composition is not particularly limited, and although it may be a molecular dispersed state, it is preferably a particle dispersed state in which the dye in a fine particle state is dispersed in the binder resin from the viewpoint of improving the heat resistance. At this time, the particle size of the dye is preferably 100 nm or less in order to reduce the impact of light scattering.

In addition to the cyanine dye and the binder resin as described above, a curing agent or a curing auxiliary agent to cure the binder resin may be added to the resin composition to form the infrared light absorption layer 5. The curing agent and the curing auxiliary agent can be appropriately selected depending on the monomer contained in the binder resin. It is preferable to use the curing agent and the curing auxiliary agent which do not have an absorption maximum wavelength at (a visible light wavelength band of) 400 to 600 nm.

The resin composition to form the infrared light absorption layer 5 may contain one or two or more dyes having an absorption maximum wavelength different from that of the cyanine dye. Further, the infrared light absorption layer 5 can be configured to include a laminate of a first absorption layer containing the cyanine dye and a second absorption layer containing a dye having an absorption maximum wavelength different from that of the cyanine dye. As described above, the cyanine dye is used in combination with a plurality of dyes having an absorption maximum wavelength different from each other, whereby the cyanine dye can absorb the infrared light at a wavelength with a low absorption coefficient and the imaging performance can be further improved.

Further, the resin composition to form the infrared light absorption layer 5 may be blended with various kinds of additives, such as oxide particles for improving the heat resistance, dispersants such as a leveling agent and a surfactant, an antioxidant, and a stabilizing agent for dyes, in addition to each of the above components.

The thickness of the infrared light absorption layer 5 is preferably set to a range of 0.5 to 200 μm from the viewpoint of making the device thinner. In the imaging device 10 of the embodiment, since the planarizing layer 4 is provided on the on-chip lens 3, the infrared light absorption layer 5 can be formed so as to have a constant thickness regardless of the shape of the on-chip lens 3. In the imaging device 10 of the present embodiment, the thickness of the infrared light absorption layer 5 does not affect the distance between the on-chip lens 3 and each of the photoelectric conversion elements 12, whereby the thickness of the infrared light absorption layer 5 can be set to a thickness capable of sufficiently removing an infrared light component.

The infrared light absorption layer 5 described above can be formed by coating the planarizing layer 4 with, for example, the resin composition that contains the cyanine dye and the binder resin using a method such as spin coating, die coating, slit coating or dispensing.

<Operation of Imaging Device 10>

Figure 2:
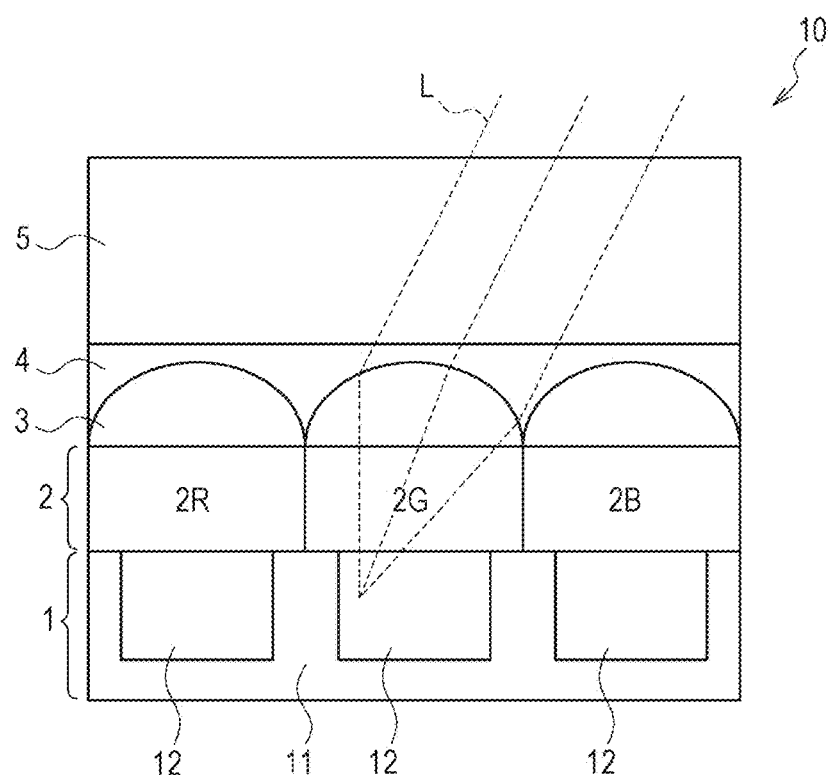
FIG. 2 is a conceptual diagram showing the operation of an imaging device 10 shown in FIG. 1.

Subsequently, the operation of an imaging device 10 of the present embodiment will be described. FIG. 2 is a conceptual diagram showing the operation of the imaging device 10 of the present embodiment. As shown in FIG. 2, the infrared light component of the light (incident light L) entering the imaging device 10 of the present embodiment is removed by the infrared light absorption layer 5. Thereafter, the incident light L from which the infrared light component is removed is refracted at the interface between the planarizing layer 4 and the on-chip lens 3, and is focused on the photoelectric conversion elements 12 after components other than a component in a predetermined wavelength band are removed by the color filters 2R, 2G, and 2B of the color filter layer 2. Then, the light entering each of the photoelectric conversion elements 12 is photoelectrically converted and output as an electrical signal.

As described in detail above, since the infrared light absorption layer is included in the imaging device of the present embodiment, it is not necessary to mount an infrared ray cut filter as a separate member. Thus, the thickness of a module can be reduced. Since the infrared light absorption layer is formed on a layer upper than the on-chip lens, the thickness of the infrared light absorption layer does not affect the distance between the on-chip lens and each of the photoelectric conversion elements. Accordingly, a reduction in resolution performance due to the fact that the incident light enters the photoelectric conversion elements adjacent to one another does not occur.

In the imaging device of the present embodiment, the cyanine dye having a specific structure is contained in the infrared light absorption layer, and thus the visible light transmittance can be improved, compared to imaging devices in related art. Consequently, an infrared light absorption layer with a low infrared light transmittance and a high visible light transmittance can be achieved, and the thickness of a module can be reduced without lowering the imaging performance.

2. Second Embodiment

Figure 3:
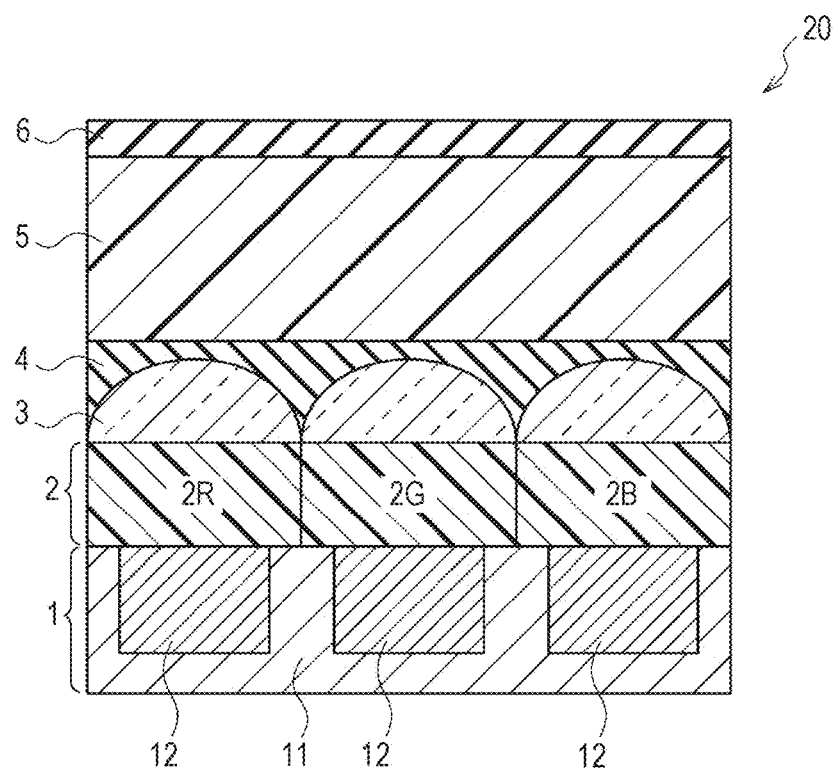
FIG. 3 is a cross-sectional view schematically showing a structure example of an imaging device of a second embodiment of the present disclosure.

Subsequently, an imaging device according to the second embodiment of the present disclosure will be described. FIG. 3 is a cross-sectional view schematically showing a structure example of an imaging device of the present embodiment. Note that, in FIG. 3, structural elements that are the same as the structural element of the imaging device of the first embodiment shown in FIG. 1 are denoted with the same reference numerals, and repeated explanation of these structural elements is omitted.

<Overall Configuration>

As shown in FIG. 3, an imaging device 20 of the present embodiment is the same as the imaging device 10 of the first embodiment described above except that the protective layer 6 is formed on the top surface, the side surface or both the surfaces of the infrared light absorption layer 5. Note that although FIG. 3 shows an example in which the protective layer 6 is formed on the infrared light absorption layer 5, the protective layer 6 may be formed only on the side surface of the infrared light absorption layer 5, or it can be formed so as to cover both the top and side surfaces of the infrared light absorption layer 5.

<Protective Layer 6>

The protective layer 6 chemically and physically protects the infrared light absorption layer 5. Examples of materials to form the protective layer 6 include silver oxide (I) ($Ag_2O$), silver monoxide (AgO), aluminium oxide ($Al_2O_3$), aluminum fluoride ($AlF_3$), barium fluoride ($BaF_2$), cerium (IV) oxide ($CeO_2$), chromium oxide (III) ($CR_2O_3$), and chromium sulfide (III) ($CR_2S_3$), gadolinium fluoride ($GdF_3$), hafnium oxide (IV) ($HfO_2$), indium tin oxide (ITO), lanthanum fluoride ($LaF_3$), lithium niobate ($LiNbO_3$), magnesium fluoride ($MgF_2$), magnesium oxide (MgO), sodium hexafluoro aluminate ($Na_3AlF_6$), niobium pentoxide ($Nb_2O_5$), nickel chrome alloy (Ni—Cr), nitride of nickel chrome alloy (NiCrNx), nitric oxide (OxNy), silicon nitride ($SiN_4$), silicon oxide (SiO), 2 silicon oxide ($SiO_2$), tantalum pentoxide ($Ta_2O_5$), titanium oxide ($Ti_2O_3$), titanium pentoxide ($Ti_3O_5$), titanium oxide (TiO), titanium dioxide ($TiO_2$), tungsten oxide ($WO_3$), yttrium oxide ($Y_2O_3$), yttrium fluoride ($YF_3$), zinc sulfide (ZnS), zirconium dioxide ($ZrO_2$), and indium oxide ($In_2O_3$), but are not limited thereto.

The infrared light absorption material contained in the infrared light absorption layer 5, such as the cyanine dye, may be decomposed or deteriorated due to an impact such as light or oxygen. Like the imaging device of the present embodiment, the protective layer 6 is provided on the front surface, the side surface or both the surfaces of the infrared light absorption layer 5, whereby the decomposition and deterioration can be prevented. As a result, excellent imaging performance can be stably obtained over a long period of time. Note that effects other than those of the imaging device of the present embodiment are the same as those of the first embodiment.

3. Third Embodiment

Subsequently, an imaging device according to the third embodiment of the present disclosure will be described.

Figure 4:
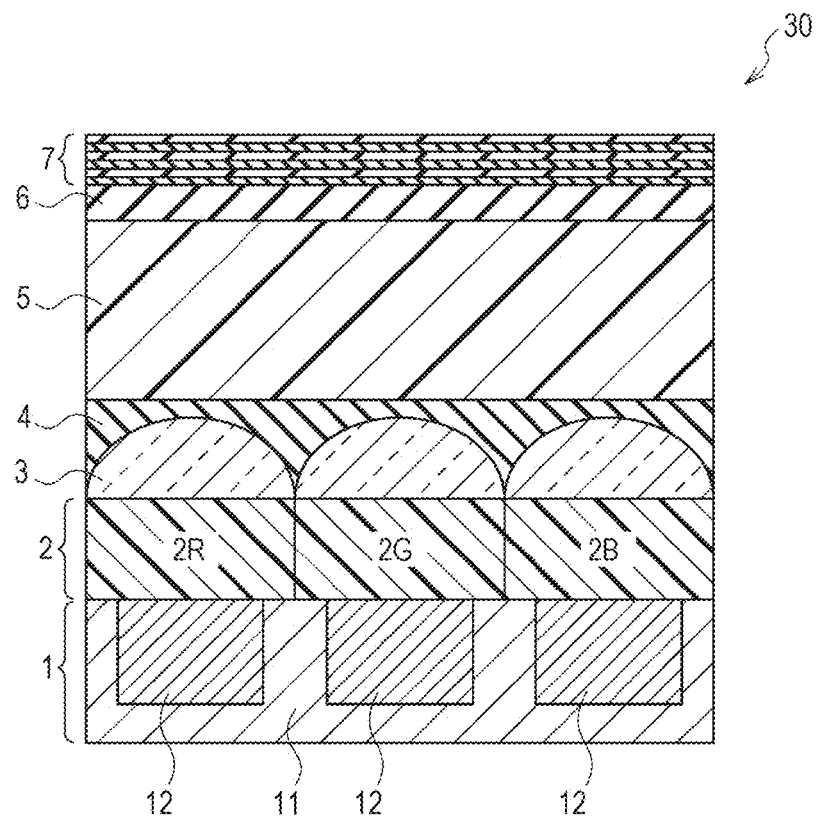
FIG. 4 is a cross-sectional view schematically showing a structure example of an imaging device of a third embodiment of the present disclosure.

FIG. 4 is a cross-sectional view schematically showing a structure example of an imaging device of the present embodiment. Note that, in FIG. 4, structural elements that are the same as the structural elements of the imaging devices of the first and second embodiments shown in FIGS. 1 and 3 are denoted with the same reference numerals, and repeated explanation of these structural elements is omitted.

<Overall Configuration>

As shown in FIG. 4, an imaging device 30 of the present embodiment is the same as the imaging device 20 of the second embodiment described above except that a light antireflection layer 7 is provided on the uppermost layer. Note that although FIG. 4 shows an example of an imaging device including the protective layer 6, the light antireflection layer 7 can also be provided in an imaging device without the protective layer. In that case, the light antireflection layer 7 may be formed on the infrared light absorption layer 5.

<Light Antireflection Layer 7>

The light antireflection layer 7 suppresses light reflection on the surface of the infrared light absorption layer 5. The light reflection occurs at the interface between substances with different refractive indices. Then, as the light antireflection layer 7, a layer including a material having a refractive index between the infrared light absorption layer 5 and the air or a layer having a structure in which a high refractive index material and a low refractive index material are laminated is provided, whereby the light reflection on the surface of the infrared light absorption layer 5 can be reduced.

Examples of high refractive index materials to form the light antireflection layer 7 include $TiO_2$, $Nb_2O_5$, $TiO_2$, $Nb_2O_5$, $CeO_2$, $Ta_2O_5$, $ZnO$, $ZrO_2$, $In_2O_3$, $SnO_2$, and $HfO_2$. These materials may be used singly, or in combination of two or more kinds thereof. Examples of low refractive index materials include $MgF_2$, $AlF_3$, and $SiO_2$. These materials may be used singly, or in combination of two or more kinds thereof.

The incident light on the imaging device may be slightly reflected at the interface between the respective layers. When the reflected light reaches the photoelectric conversion elements, the light which is not the original imaging light enters the photoelectric conversion elements. This leads to a decrease in imaging performance. Then, the re-reflection of the reflected light is prevented by the light antireflection layer, whereby a decrease in imaging performance can be prevented.

Note that another layer such as a coating layer may be provided in the imaging device 30 of the present embodiment in the range which does not impair the effect of the light antireflection layer 7. Further, effects other than those of the imaging device of the present embodiment are the same as those of the first and second embodiments.

4. Fourth Embodiment

Subsequently, an imaging device according to the fourth embodiment of the present disclosure will be described.

Figure 5:
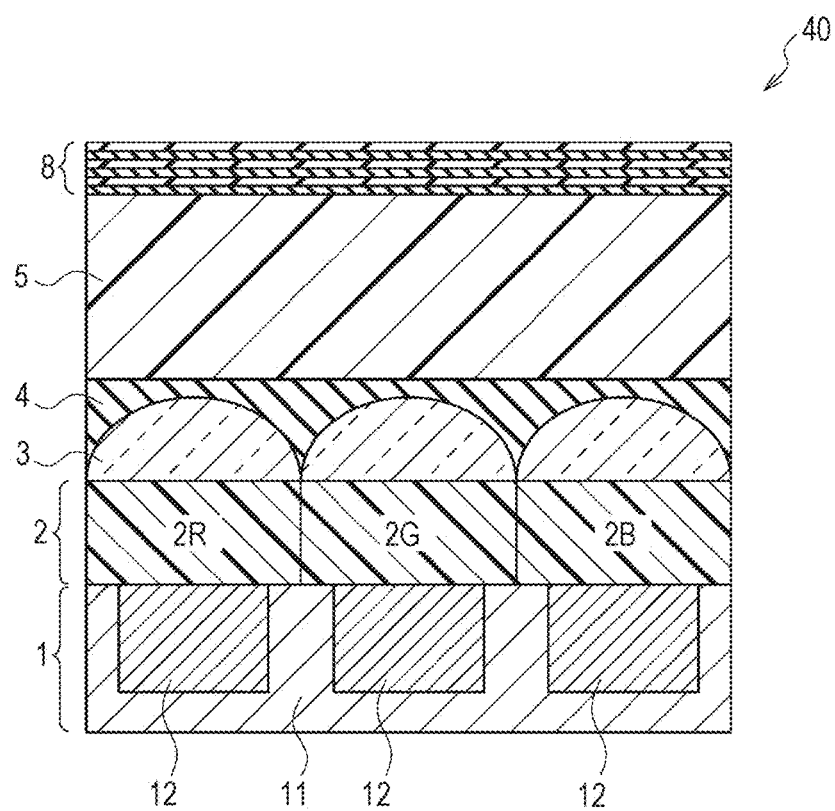
FIG. 5 is a cross-sectional view schematically showing a structure example of an imaging device of a fourth embodiment of the present disclosure.

FIG. 5 is a cross-sectional view schematically showing a structure example of an imaging device of the present embodiment. Note that, in FIG. 5, structural elements that are the same as the structural elements of the imaging devices of the first and second embodiments shown in FIGS. 1 and 3 are denoted with the same reference numerals, and repeated explanation of these structural elements is omitted.

<Overall Configuration>

As shown in FIG. 5, an imaging device 40 of the present embodiment is the same as the imaging device 10 of the first embodiment described above except that a band-pass layer 8 is provided on a layer upper than the infrared light absorption layer 5. Note that the protective layer may be provided in the imaging device 40 of the present embodiment, similarly to the second embodiment described above. In that case, the protective layer may be provided on a layer upper than the band-pass layer 8, or may be provided between the band-pass layer 8 and the infrared light absorption layer 5. Further, in the imaging device 40 of the present embodiment, the light antireflection layer can also be provided on the uppermost layer, similarly to the third embodiment described above.

<Band-Pass Layer 8>

The band-pass layer 8 reflects (covers) part or all of purple light, the light having a wavelength shorter than that of the purple light, the infrared light or both of them, and has a configuration in which a first reflection layer including a high refractive index material and a second reflection layer including a low refractive index material, lower than the refractive index of the first reflection layer are alternatively laminated on each other.

Here, examples of high refractive index materials to form the first reflection layer include $TiO_2$, $Nb_2O_5$, $TiO_2$, $Nb_2O_5$, $CeO_2$, $Ta_2O_5$, $ZnO$, $ZrO_2$, $In_2O_3$, $SnO_2$, and $HfO_2$. These materials may be used singly, or in combination of two or more kinds thereof. Examples of low refractive index materials to form the second reflection layer include $MgF_2$, $AlF_3$, and $SiO_2$. These materials may be used singly, or in combination of two or more kinds thereof. The number of lamination of the first reflection layer and the second reflection layer is not particularly limited, and it can be appropriately set according to the necessary performance.

In the band-pass layer 8 along with the infrared light absorption layer 5, the infrared light component can be removed from the incident light. Since the band-pass layer 8 provided in the imaging device 40 of the present embodiment uses the interference of light between multilayer films, the transparent wavelength may shift depending on the incidence angle of the incident light. Even in such a case, the transparent wavelength band can be maintained by the infrared light absorption layer 5 which does not theoretically cause a shift of the transparent wavelength. Accordingly, excellent imaging performance can be maintained.

Note that effects other than those of the imaging device of the present embodiment are the same as those of the first and second embodiments.

5. Fifth Embodiment

Figure 6:
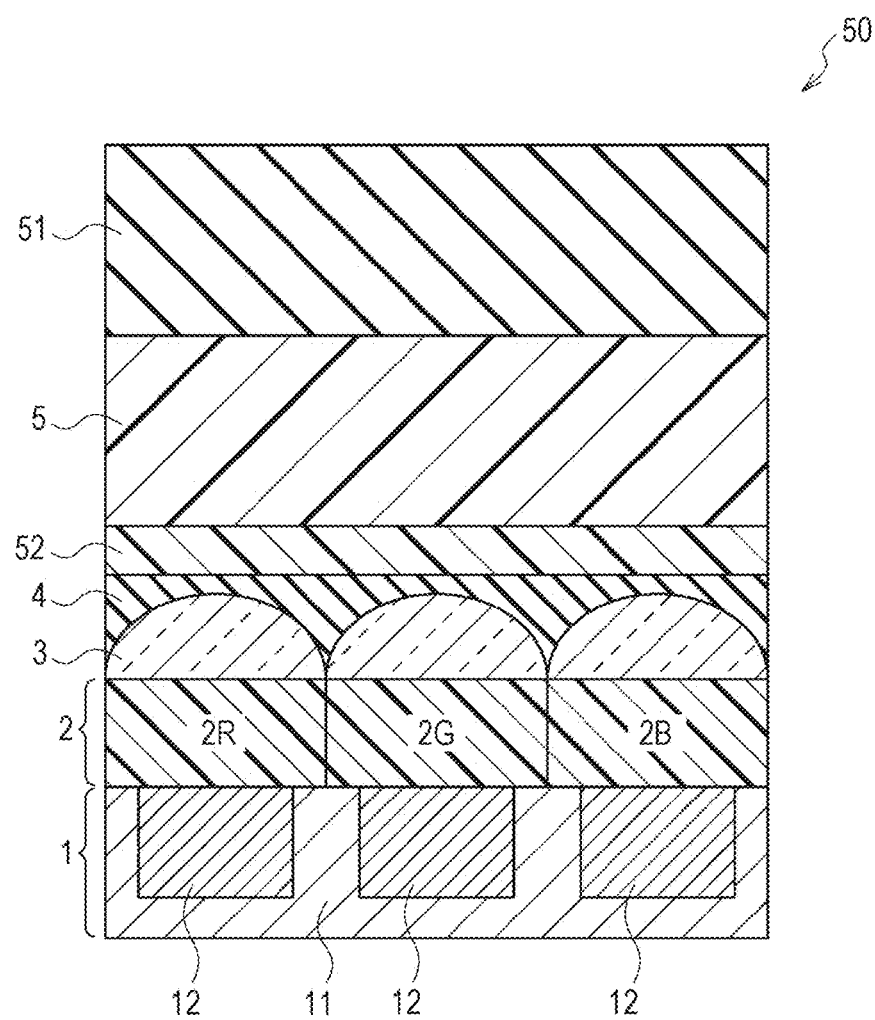
FIG. 6 is a cross-sectional view schematically showing a structure example of an imaging device of a fifth embodiment of the present disclosure.

Subsequently, an imaging device according to the fifth embodiment of the present disclosure will be described. FIG. 6 is a cross-sectional view schematically showing a structure example of an imaging device of the present embodiment. Note that, in FIG. 6, structural elements that are the same as the structural element of the imaging device of the first embodiment shown in FIG. 1 are denoted with the same reference numerals, and repeated explanation of these structural elements is omitted.

<Overall Configuration>

As shown in FIG. 6, an imaging device 50 of the present embodiment includes a supporting substrate 51 that supports the infrared light absorption layer 5, and is the same as the imaging device 10 of the first embodiment described above except that the infrared light absorption layer 5 is laminated on the planarizing layer 4 through an adhesive layer 52. Note that in the imaging device 50 of the present embodiment, the protective layer may be provided, similarly to the second embodiment described above, or the light antireflection layer can also be provided on the uppermost layer, similarly to the third embodiment described above. Further, the band-pass layer 8 may be provided, similarly to the fourth embodiment described above.

<Supporting Substrate 51>

The supporting substrate 51 can be formed of a material having a strength capable of supporting the infrared light absorption layer 5 and transparency. A glass sheet, a transparent resin sheet or the like can be used.

<Adhesive Layer 52>

The adhesive layer 52 can attach the planarizing layer 4 to the infrared light absorption layer 5, and can be formed of a material having transparency. Examples of materials of the adhesive layer 52 include synthetic resins.

The imaging device of the present embodiment has the infrared light absorption layer formed on the supporting substrate, whereby the infrared light absorption layer can be produced by a separate process from other layers. Note that effects other than those of the imaging device of the present embodiment are the same as those of the first embodiment.

6. Sixth Embodiment

Subsequently, an imaging device according to the sixth embodiment of the present disclosure will be described. The imaging apparatus of the present embodiment includes the imaging device of any of the first to fifth embodiments described above, and an imaging optical system that focuses the incident light on the photoelectric conversion layer of the imaging device. Since the imaging apparatus of the present embodiment uses the imaging device including an infrared light absorption layer, the infrared light included in the incident light can be removed even when the infrared light cut filter is not provided separately. The size of the imaging apparatus can be reduced and the thickness of the imaging optical system can be reduced.

Note that the present disclosure does not eliminate the process of disposing the infrared light cut filter, for example, in the case of putting more emphasis on an improvement in imaging performance than a reduction in size, the imaging device of any of the first to fifth embodiments described above can be used in combination with the infrared light cut filter. That is, the imaging device of any of the first to fifth embodiments as well as an infrared light cut filter that absorbs or reflects infrared light may be provided in the imaging apparatus of the present embodiment. In that case, the infrared light cut filter is arranged in the imaging optical system or may be arranged between the imaging device and the imaging optical system. Thus, the incidence of infrared light on the photoelectric conversion element can be further reduced.

In the imaging apparatus of the present embodiment, the imaging device including the infrared light absorption layer is used, whereby the thickness of a module can be reduced without lowering the imaging performance. Further, since the infrared absorption layer is arranged at a position near the device, a ghost suppressing effect is exerted. Furthermore, the interface reflection can be reduced, whereby the visible light transmittance can also be improved.

Additionally, the infrared light cut filter as a separate member is not necessary for the imaging apparatus of the present embodiment, whereby the installing operation during assembly is not necessary. This is effective in reducing the production cost. In the case where the infrared cut filter is present as a separate part, defects such as drop-off may occur. However, the defects are not caused since the imaging apparatus of the present embodiment is integrated with the inside of the device.

Note that effects other than those of the imaging apparatus of the present embodiment are the same as those of the first to fifth embodiments.

Further, the present disclosure may also take the following structures.

(1)
An imaging device including:
an on-chip lens;
a planarizing layer formed on the on-chip lens; and
an infrared light absorption layer that is provided on a layer upper than the planarizing layer and contains and a cyanine dye represented by Chemical Formula (A) below.

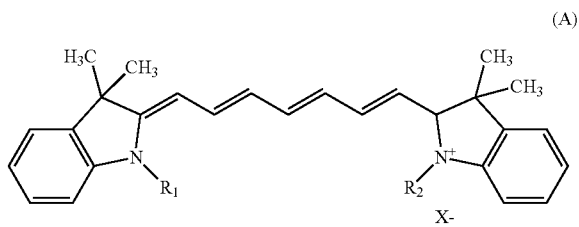

(A)

(wherein $R_1$ and $R_2$ represent a chain or cyclic alkyl group, a group having one or two or more hydrogen atoms in the alkyl group substituted with at least one functional group of a halogen atom, an alkoxy group, an alkanoloxy group, an amino group, a thiol group, and a mercapto group, a group having at least one reactive group of a vinyl group, an acrylic group, a carbonyl group, a carboxyl group, an alkenyl group, an alkenyloxy group, an alkoxycarbonyl group, a nitrile group, a carboxyl group, a carbonyl group, a sulfonyl group, a sulfamoyl group, a carbamoyl group, a benzoyloxy group, and a cyano group introduced to the terminal of the alkyl group or a position where two or more carbon atoms are away from the indoline ring, a phenyl group or benzyl, and may be the same as or different from each other, and $X^-$ represents an anion.)

(2)
The imaging device according to (1), wherein in the cyanine dye, one or both of $R_1$ and $R_2$ in Chemical Formula (A) are a linear alkyl group having 1 to 16 carbon atoms, a group having a siloxane, alkoxysilane, acrylic or epoxy structure introduced to the terminal of the alkyl group, a polyether group, a benzyl group or a phenyl group.

(3)
The imaging device according to (1) or (2), wherein a cyanine dye which has an absorption maximum wavelength at 600 to 1200 nm and has a ratio of a molar extinction coefficient in the absorption maximum wavelength in the range of 400 to 600 nm to a molar extinction coefficient in the absorption maximum wavelength in the range of 600 to 1200 nm of 0.1 or less.

(4)
The imaging device according to any of (1) to (3), wherein the infrared light absorption layer is formed of a resin composition that contains the cyanine dye and a binder resin.

(5)
The imaging device according to (4), wherein the binder resin is a heat-curable or light-curable resin that does not have an absorption maximum wavelength at 400 to 600 nm.

(6)
The imaging device according to (4) or (5), wherein the binder resin is a resin having a siloxane bond as a main skeleton.

(7)
The imaging device according to any of (1) to (6), wherein the infrared light absorption layer further contains one or two or more dyes having an absorption maximum wavelength different from that of the cyanine dye.

(8)
The imaging device according to any of (1) to (6), wherein the infrared light absorption layer is configured to include a laminate of a first absorption layer containing the cyanine dye and a second absorption layer containing a dye having an absorption maximum wavelength different from that of the cyanine dye.

(9)
The imaging device according to any of (1) to (8), wherein the infrared light absorption layer has a thickness of 0.5 to 200 μm.

(10)
The imaging device according to any of (1) to (9), wherein the on-chip lens is formed of a high refractive index material, and the planarizing layer is formed of a low refractive index material, lower than the refractive index of the on-chip lens.

(11)
The imaging device according to any of (1) to (10), wherein in the cyanine dye, X in Chemical Formula (A) represents at least one anion selected from a tetrafluoro antimonate ion, a bis(halogenoalkylsulfonyl)imide ion, a tetrakis(halogeno alkyl)borate ion, and a bis(dicarboxylate)borate ion.

(12)
The imaging device according to any of (1) to (11), wherein a protective layer is provided on the infrared light absorption layer.

(13)
The imaging device according to any of (1) to (12), including a band-pass layer in which a first reflection layer including a high refractive index material and a second reflection layer including a low refractive index material, lower than the refractive index of the first reflection layer are alternatively laminated on each other.

(14)
The imaging device according to any of (1) to (13), wherein a light antireflection layer is provided on the uppermost layer.

(15)
The imaging device according to any of (1) to (14), wherein a color filter layer is provided between the on-chip lens and a photoelectric conversion layer.

(16)
The imaging device according to (15), wherein the color filter layer has an absorption maximum wavelength at 600 to 1200 nm.

(17)
The imaging device according to any of (1) to (15), including a supporting substrate that supports the infrared light absorption layer.

(18)
The imaging device according to any of (1) to (16), wherein an adhesive layer is provided on the planarizing layer.

(19)
An imaging apparatus including the imaging device according to any of (1) to (18).

(20)
The imaging apparatus according to (19), including an imaging optical system that focuses the incident light on the photoelectric conversion layer of the imaging device, wherein an infrared light cut filter that absorbs or reflects infrared light is provided in the imaging optical system or is provided between the imaging device and the imaging optical system.

(21) An imaging device, comprising:
an infrared light absorption layer including a cyanine dye represented by Chemical Formula (A) below:

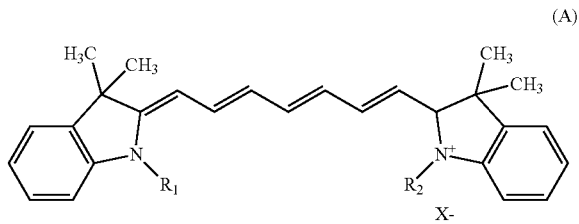

(A)

wherein $R_1$ and $R_2$ are selected from the group consisting of: a chain alkyl group, a cyclic alkyl group, a phenyl group, and a benzyl group; wherein the chain alkyl group and the cyclic alkyl group including at least one group member selected from the group consisting of: 1) a first group having one or more hydrogen atoms in a first alkyl group substituted with at least one functional group selected from the group consisting of: a halogen atom, an alkoxy group, an alkanoloxy group, an amino group, a thiol group, and a mercapto group; 2) a second group having at least one reactive group selected from the group consisting of: a vinyl group, an acrylic group, a carbonyl group, a carboxyl group, an alkenyl group, an alkenyloxy group, an alkoxycarbonyl group, a nitrile group, a carboxyl group, a carbonyl group, a sulfonyl group, a sulfamoyl group, a carbamoyl group, a benzoyloxy group, and a cyano group, wherein the reactive group is any one of introduced at a terminal alkyl group of at least one of the chain alkyl group and the cyclic alkyl group and positioned two or more carbon atoms away from an indoline ring; 3) an unsubstituted chain alkyl group; and 4) an unsubstituted cyclic alkyl group; and wherein $X^-$ represents an anion.

(22) The imaging device according to (21), wherein at least one of $R_1$ and $R_2$ are selected from the group consisting of 1) a linear alkyl group having 1 to 16 carbon atoms, 2) a group having a siloxane, alkoxysilane, acrylic or epoxy structure introduced to the terminal alkyl group of the chain alkyl group, 3) a polyether group, 4) the benzyl group, and 5) the phenyl group.

(23) The imaging device according to (21) or (22), wherein the cyanine dye includes an absorption maximum wavelength at 600 nm to 1200 nm and has a ratio of a molar extinction coefficient in the absorption maximum wavelength in a range of 400 nm to 600 nm to a molar extinction coefficient in the absorption maximum wavelength in a range of 600 nm to 1200 nm, and wherein the ratio is 0.1 or less.

(24) The imaging device according to any of (21) to (23), wherein the infrared light absorption layer includes a resin composition that contains the cyanine dye and a binder resin.

(25) The imaging device according to (24), wherein the binder resin is a heat-curable or light-curable resin that does not have an absorption maximum wavelength at 400 nm to 600 nm.

(26) The imaging device according to any of (21) to (25), wherein the binder resin is a resin having a siloxane bond as a main skeleton.

(27) The imaging device according to any of (21) to (26), wherein the infrared light absorption layer further contains one or more dyes having an absorption maximum wavelength different from the cyanine dye.

(28) The imaging device according to any of (21) to (27), wherein the infrared light absorption layer is configured to include a laminate of a first absorption layer containing the cyanine dye and a second absorption layer containing a dye having an absorption maximum wavelength different from the cyanine dye.

(29) The imaging device according to any of (21) to (28), wherein the infrared light absorption layer has a thickness of 0.5 μm to 200 μm.

(30) The imaging device according to any of (21) to (29), further comprising an on-chip lens and a planarizing layer formed on the on-chip lens, wherein the infrared light absorption layer is provided above the planarizing layer.

(31) The imaging device according to any of (21) to (30), further comprising a color filter, wherein the color filter is provided under the infrared light absorption layer.

(32) The imaging device according to any of (21) to (31), wherein the on-chip lens includes a high refractive index material, and the planarizing layer includes a low refractive index material that has a lower refractive index than the on-chip lens.
(33) The imaging device according to any of (21) to (32), wherein X represents at least one anion selected from the group consisting of: a tetrafluoro antimonate ion, a bis(halogenoalkylsulfonyl)imide ion, a tetrakis(halogeno alkyl)borate ion, and a bis(dicarboxylate)borate ion.
(34) The imaging device according to any of (21) to (33), wherein a protective layer is provided on the infrared light absorption layer.
(35) The imaging device according to any of (21) to (34), comprising a band-pass layer including a first reflection layer including a high refractive index material and a second reflection layer including a low refractive index material that has a lower refractive index than the first reflection layer, wherein the first reflection layer and the second reflection layer are alternatively laminated on each other.
(36) The imaging device according to any of (21) to (35), further comprising a protective layer provided on the infrared light absorption layer.
(37) The imaging device according to any of (21) to (36), wherein a light antireflection layer is provided on the uppermost layer.
(38) The imaging device according to any of (21) to (37), wherein a color filter layer is provided between the on-chip lens and a photoelectric conversion layer.
(39) An imaging apparatus comprising the imaging device according to any of (21) to (38).
(40) The imaging apparatus according to (39), comprising an imaging optical system configured to focus the incident light on the photoelectric conversion layer of the imaging device, wherein an infrared light cut filter is provided in the imaging optical system or is provided between the imaging device and the imaging optical system.

Note that the effects described in the present specification are absolutely exemplary, and are not limited. Further, there may be other effects.

EXAMPLES

Hereinafter, the effects of the present disclosure will be specifically described with reference to Examples and Comparative Examples of the present disclosure. In the present example, the dye having the structure shown in Chemical Formula 3 below (Example 1), vanadyl phthalocyanine (Comparative Example 1), and the dye having the structure shown in Chemical Formula 4 below (Comparative Example 2) were used to form infrared light absorption layers. The infrared light (800 nm) transmittance and visible light (550 nm) transmittance of each of the layers were measured. At that time, a heat-curable siloxane resin was used as the binder resin. The measurement results of samples prepared using the dyes of Example and Comparative Examples are shown in Table 1 below.

<Chemical Formula 3>

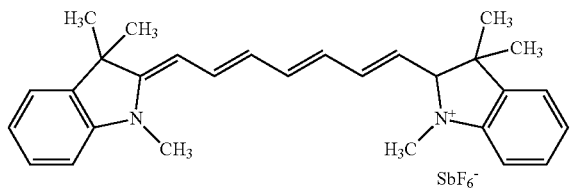

SbF$_6^-$

<Chemical Formula 4>

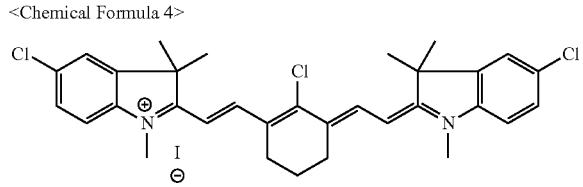

TABLE 1

| Infrared light absorption dye | | Transmittance of infrared light (800 nm) | Transmittance of visible light (550 nm) |
| --- | --- | --- | --- |
| Example 1 | Chemical Formula 3 | 0.5% | 97.5% |
| Comparative Example 1 | Vanadyl phthalocyanine | 0.5% | 71.1% |
| Comparative Example 2 | Chemical Formula 4 | 0.5% | 91.2% |

As shown in Table 1, the visible light transmittance of the dye of Example 1 is higher than that of the dye of Comparative Example 1 or 2. This result confirmed that the use of the cyanine dye having a specific structure allows an infrared light absorption layer with a low infrared light transmittance and a high visible light transmittance to be achieved.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Photoelectric conversion layer
2 Color filter layer
3 On-chip lens
4 Planarizing layer
5 Infrared light absorption layer
6 Protective layer
7 Light antireflection layer
8 Band-pass layer
10, 20, 30, 40, and 50 Imaging device
11 Substrate
12 Photoelectric conversion element
51 Supporting substrate
52 Adhesive layer

The invention claimed is:
1. An imaging device, comprising:
an infrared light absorption layer including a cyanine dye represented by Chemical Formula (A) below:

(A)

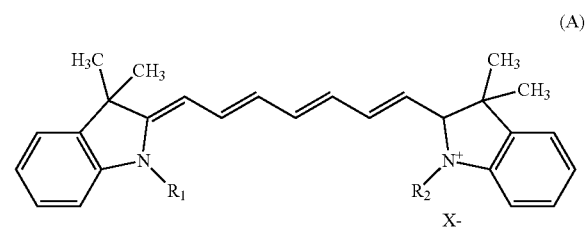

X- wherein R₁ and R₂ are selected from the group consisting of: a chain alkyl group, a cyclic alkyl group, a phenyl group, and a benzyl group; wherein the chain alkyl group and the cyclic alkyl group including at least one group member selected from the group consisting of: 1) a first group having one or more hydrogen atoms in a first alkyl group substituted with at least one functional group selected from the group consisting of: a halogen atom, an alkoxy group, an alkanoloxy group, an amino group, a thiol group, and a mercapto group; and 2) a second group having at least one reactive group selected from the group consisting of: a vinyl group, an acrylic group, a carbonyl group, a carboxyl group, an alkenyl group, an alkenyloxy group, an alkoxycarbonyl group, a nitrile group, a carboxyl group, a carbonyl group, a sulfonyl group, a sulfamoyl group, a carbamoyl group, a benzoyloxy group, and a cyano group, wherein the reactive group is introduced to any one of a terminal alkyl group and a second alkyl group positioned two or more carbon atoms away from an indoline ring; 3) an unsubstituted chain alkyl group; and 4) an unsubstituted cyclic alkyl group; and wherein X⁻ represents an anion, wherein the cyanine dye has a first molar extinction coefficient in a first wavelength range of 400 nm to 600 nm and a second molar extinction coefficient in a second wavelength range of 600 nm to 1200 nm, and wherein a ratio of the first molar extinction coefficient to the second molar extinction coefficient is 0.1 or less.

2. The imaging device according to claim 1, wherein R₁ and R₂ are selected from the group consisting of 1) a linear alkyl group having 1 to 16 carbon atoms, 2) a group having a siloxane, alkoxysilane, acrylic or epoxy structure introduced to the terminal alkyl group of at least one of the chain alkyl group and the cyclic alkyl group, 3) a polyether group, 4) the benzyl group, and 5) the phenyl group.

3. The imaging device according to claim 1, wherein the infrared light absorption layer includes a resin composition that contains the cyanine dye and a binder resin.

4. The imaging device according to claim 3, wherein the binder resin is a heat-curable or light-curable resin that does not have an absorption maximum wavelength at 400 nm to 600 nm.

5. The imaging device according to claim 3, wherein the binder resin is a resin having a siloxane bond as a main skeleton.

6. The imaging device according to claim 1, wherein the infrared light absorption layer further contains one or more dyes having an absorption maximum wavelength different from the cyanine dye.

7. The imaging device according to claim 1, wherein the infrared light absorption layer is configured to include a laminate of a first absorption layer containing the cyanine dye and a second absorption layer containing a dye having an absorption maximum wavelength different from the cyanine dye.

8. The imaging device according to claim 1, wherein the infrared light absorption layer has a thickness of 0.5 μm to 200 μm.

9. The imaging device according to claim 1, further comprising an on-chip lens and a planarizing layer formed on the on-chip lens, wherein the infrared light absorption layer is provided above the planarizing layer.

10. The imaging device according to claim 9, further comprising a color filter, wherein the color filter is provided under the infrared light absorption layer.

11. The imaging device according to claim 9, wherein the on-chip lens includes a high refractive index material, and the planarizing layer includes a low refractive index material that has a lower refractive index than the on-chip lens.

12. The imaging device according to claim 1, wherein X⁻ represents at least one anion selected from the group consisting of: a tetrafluoro antimonate ion, a bis(halogenoalkylsulfonyl)imide ion, a tetrakis(halogeno alkyl)borate ion, and a bis(dicarboxylate)borate ion.

13. The imaging device according to claim 1, wherein a protective layer is provided on the infrared light absorption layer.

14. The imaging device according to claim 1, comprising a band-pass layer including a first reflection layer including a high refractive index material and a second reflection layer including a low refractive index material that has a lower refractive index than the first reflection layer, wherein the first reflection layer and the second reflection layer are alternatively laminated on each other.

15. The imaging device according to claim 14, further comprising a protective layer provided on the infrared light absorption layer.

16. The imaging device according to claim 1, wherein a light antireflection layer is provided on the uppermost layer.

17. The imaging device according to claim 1, wherein a color filter layer is provided between an on-chip lens and a photoelectric conversion layer.

18. An imaging apparatus comprising the imaging device according to claim 1.

19. The imaging apparatus according to claim 18, comprising an imaging optical system configured to focus the incident light on the photoelectric conversion layer of the imaging device, wherein an infrared light cut filter is provided in the imaging optical system or is provided between the imaging device and the imaging optical system.

* * * * *